(12) United States Patent
Tanaka

(10) Patent No.: US 6,886,151 B2
(45) Date of Patent: Apr. 26, 2005

(54) DESIGN METHOD FOR MULTILAYER WIRING BOARD

(75) Inventor: Shinji Tanaka, Tokyo (JP)

(73) Assignee: NEC Corporation, Tokyo (JP)

(*) Notice: Subject to any disclaimer, the term of this patent is extended or adjusted under 35 U.S.C. 154(b) by 264 days.

(21) Appl. No.: 10/150,961

(22) Filed: May 21, 2002

(65) Prior Publication Data
US 2002/0174413 A1 Nov. 21, 2002

(30) Foreign Application Priority Data
May 21, 2001 (JP) .................... 2001-150433

(51) Int. Cl.$^7$ ............................. G06F 17/50
(52) U.S. Cl. ................... 716/15; 716/14; 716/12
(58) Field of Search ............... 716/15, 14, 12

(56) References Cited

U.S. PATENT DOCUMENTS

| | | | | |
|---|---|---|---|---|
| 5,562,970 A | * | 10/1996 | Satoh | 428/209 |
| 5,879,568 A | * | 3/1999 | Urasaki et al. | 216/18 |
| 6,192,581 B1 | * | 2/2001 | Tsukamoto | 29/852 |

FOREIGN PATENT DOCUMENTS

| | | | | |
|---|---|---|---|---|
| JP | 04243485 A | * | 8/1992 | G06F/17/50 |
| JP | 5-243731 | | 9/1993 | |
| JP | 411259540 A | * | 9/1999 | H05K/3/46 |
| JP | 2000332412 A | * | 11/2000 | H05K/3/46 |

OTHER PUBLICATIONS

Miyazaki et al., "Fabrication of Thin Film Multilayer Substrate Using Copper Clad Polyimide Sheets", Jun. 1993, IEEE Proceedings, 43rd Electronic Components and Technology Conference, pp. 306–310.*

Shimoto et al., "New High–Density Multilayer Technology on PCB", May 1998, IEEE Proceedings, 48th Electronic Components and Technology Conference, pp. 158–164.*

Shimoto et al., "New High–Density Multilayer Technology on PCB", May 1999, IEEE Transactions on Advanced Packaging, vol. 22, iss. 2, pp. 116–122.*

* cited by examiner

*Primary Examiner*—Vuthe Siek
*Assistant Examiner*—Sun James Lin
(74) *Attorney, Agent, or Firm*—Young & Thompson

(57) ABSTRACT

A method of routing in a multilayer wiring board, such as a built-up wiring board, which is interconnected by via holes between only adjacent layers includes steps of reading a parameter for each kind of built-up via of a multilayer wiring board, and setting a via hole size, shift direction, and via pitch of each layer. The information of the read parameter is stored in a memory. In a routing step, wirings of the multilayer wiring board having a built-up via is designed based on the information of the parameter stored in the memory in the parameter reading step, and an instruction for a start layer and a last layer.

7 Claims, 13 Drawing Sheets

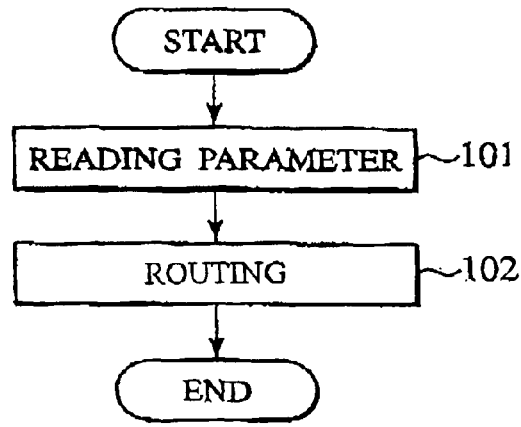
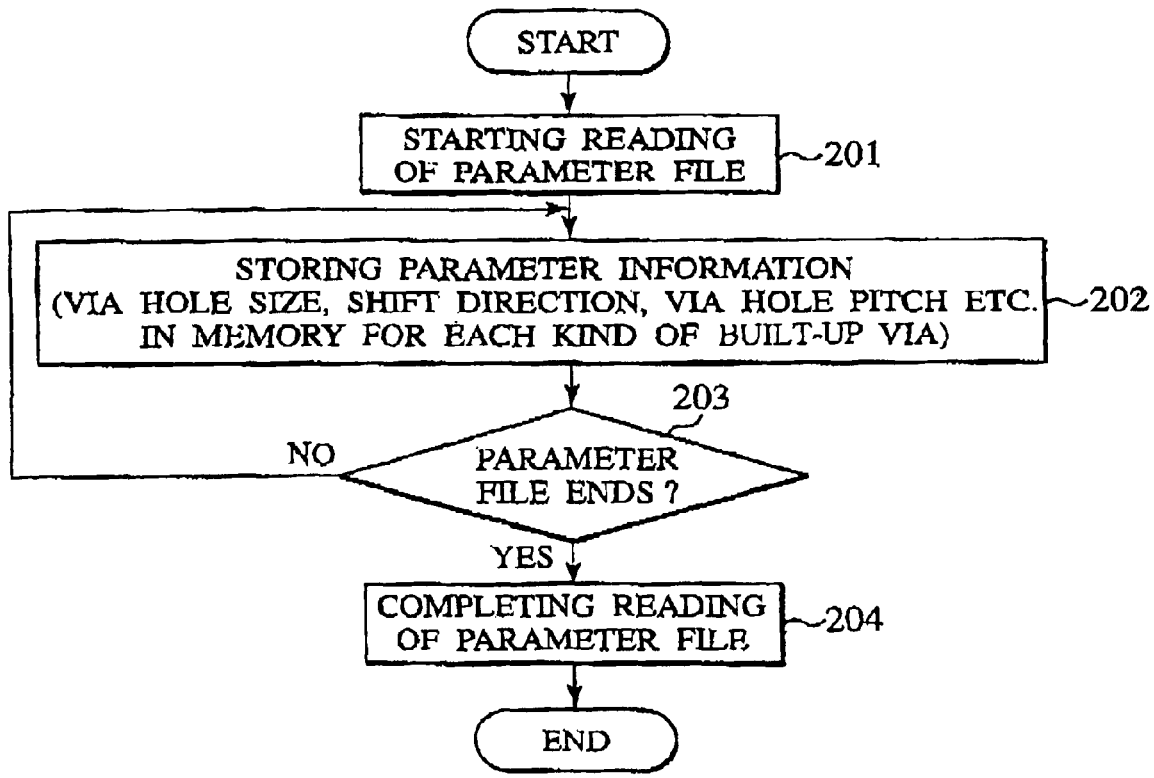

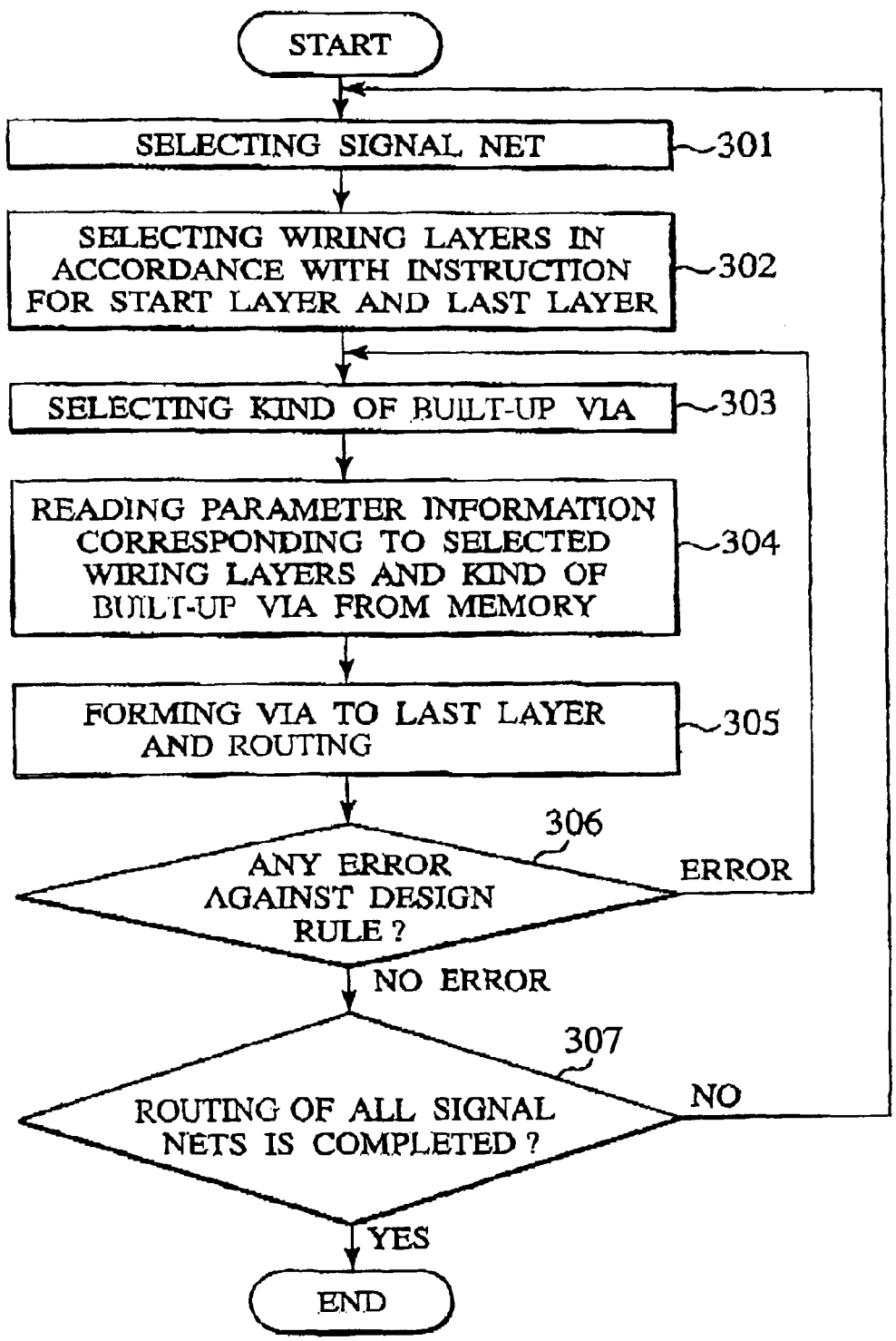

| | |
|---|---|
| a | # LAND:75 ANGL:E # |
| b | ( built-up _via_group" BUILT-UP 75-E" ) |
| c | ( built-up "VIA75" B4 B3) |
| d | (moveto "LINE75"+75 0) |
| e | ( built-up "VIA75" B3 B2) |
| f | (moveto "LINE75"-75 0) |
| g | ( built-up "VIA75" B2 B1) |
| h | (moveto "LINE75"+75 0) |
| i | ( built-up "VIA75" B1 C1) |
| j | (moveto "LINE120"-350 0) |

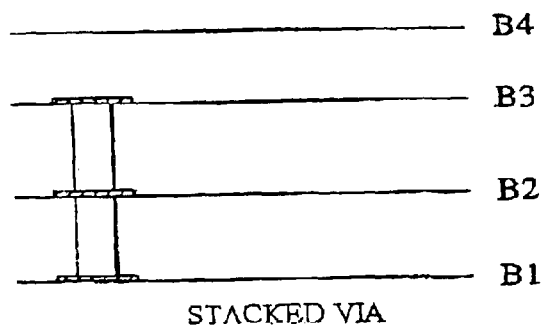
FIG.11 (PRIOR ART)
STACKED VIA
(PRIOR ART)
FIG.12A
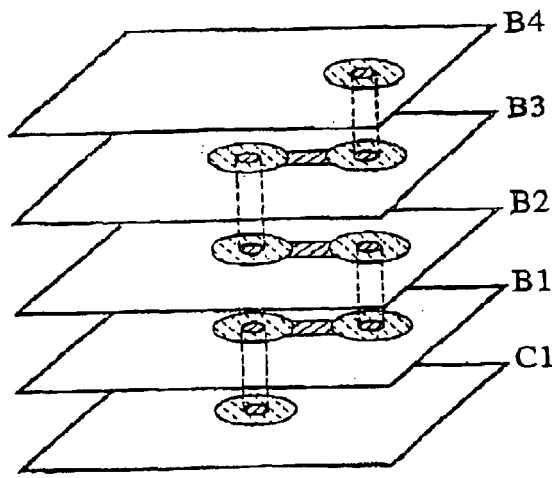
FIG.12B (PRIOR ART)
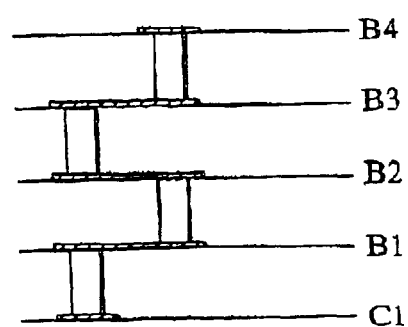

DESIGN METHOD FOR MULTILAYER WIRING BOARD

BACKGROUND OF THE INVENTION

1. Field of the Invention

The present invention relates to a design method for multilayer wiring board which is made of an interconnection design using a via hole for interconnecting only adjacent layers. In the present invention, a multilayer wiring board refers to a wiring board which has an electronic component such as LSI (Large Scale Integration) mounted on a surface thereof, and has at least two or more signal layers thereinside.

Specifically, the present invention relates not to a wiring board in which layers are interconnected by a through hole, but to a multilayer wiring board in which interconnection of layers is realized with combination of via holes which interconnect adjacent layers. In the present invention, a wring board in which layers are interconnected by a through hole refers to a general printed circuit board.

In addition, the present invention relates to a multilayer wiring board in which overlapping of via holes (stacked via) is not allowed.

2. Description of the Related Art

Unexamined Japanese Patent Application KOKAI Publication No. H5-243731 is a Patent Gazette which relates to a prior art of the multilayer wiring board designing method of the present invention, and is similar to the present invention since it considers a structure and design of a multilayer wiring board.

However, the technology (multi thin film layer wiring board) disclosed in the above Unexamined Japanese Patent Application KOKAI Publication No. H5-243731 is a technology aiming for allowing utilization of interconnection routing tools for conventional general-purpose multilayer wiring boards, by designing interconnection terminals of all pairs of layers including via holes to be at the same coordinates. Thus, this technology is essentially different from the present invention which aims for improving a design efficiency for a multilayer wiring board by presetting parameters for each kind of built-up via hole.

For example, a built-up wiring board and a polyimide thin film wing board are multilayer wiring boards suitable as the target of applying the present invention. A polyimide thin film wiring board refers to a wiring board made of a base Ceramic wiring board having a polyimide thin film on the surface layer thereof. That is, a polyimide thin film wiring board is a multilayer wiring board formed by using photosensitive polyimide resin as an insulation material, forming a via hole in this resin layer, and forming a wiring layer using photolithography, vacuum deposition or sputtering, and plating technology. Each time the series of those processes is performed, a set of an insulation layer and a wiring layer is formed, and by repeating those processes, a multilayer wiring board is completed.

FIG. 9 is a diagram showing a structure of a specific example of a built-up wiring board, which is the most typical example of the multilayer wiring board according to the present invention. FIG. 9 shows a single-side four layered built-up wiring board.

The built-up wiring board of the present invention is formed of a core substrate (base substrate) and a built-up layer.

A glass epoxy resin as an insulation material, which is used as a general printed circuit board, is used as the core substrate. Through holes formed in order to interconnect the top surface and bottom surface of the core substrate. The core substrate functions as a structural base for supporting the whole wiring board, and also functions as a low-density layer such as a power source layer, a ground layer, etc.

On the other hand, the built-up layered portion is formed by alternately laminating a required number of wiring made by copper plating, and epoxy resin layers as insulation layers, on the core substrate. At that time, as means for forming via holes for interconnecting the built-up layered portion, there is a method of forming via hales by etching using photolithography, and a method of directly forming via holes using laser.

The built-up wiring board shown in FIG. 9 is formed as described below, and is formed as a wiring board corresponding to higher density LSI terminals.

That is, the built-up Wiring board according to the present invention uses a sheet of a glass cloth soaked with ordinary epoxy resin as an insulation material, and uses a printed circuit board in which internal and external layers are electrically interconnected by through holes as the core substrate. A photosensitive resin insulation layer is formed on the core substrate.

The built-up layered portion of the built-up wiring board according to the present invention is formed by sequentially depositing built-up layers (B1 layer to B4 layer in FIG. 9) while forming built-up via holes having extremely small diameters by photolithography and laser, connecting the presently-built-up layer to the underneath layer by plating and forming routes by plating.

In such a built-up wiring board, no interlayer connection via holes other than via holes that interconnects only adjacent layers are allowed.

Therefore, as shown in a perspective diagram of FIG. 10A, a signal route (a signal route using a plurality of via holes), which goes through the B2 layer sandwiched between the B3 layer and B1 layer, includes a first via hole which interconnects the B3 layer and the B2 layer, a second via hole which interconnects the B2 layer and the B1 layer, and a short route which connects the bottom land of the first via hole and the top land of the second via hole. In the present specification, such a signal route as made of plurality of via holes and a short route is referred to as a built-up via.

FIG. 10B shows a cross section which corresponds to the perspective diagram shown in FIG. 10A. A via hole pitch between the bottom land of the first via hole and the top land of the second via hole may preferably be set as the smallest value that is possible when being manufactured, from the viewpoint of improving capacity of the route.

For example, in such a built-up wiring board, via holes that are φ50 micrometer in diameter are formed on lands (both top and bottom) that are φ75 micrometer in diameter by carbon dioxide gas laser. A top land and a bottom land are arranged with a pitch of 100 micrometer, and the route which connects those top and bottom lands has a width of 50 micrometer.

According to the method of manufacturing the built-up wiring board of the present invention, it is prohibited from a manufacturing viewpoint that via holes overlap each other, like the stacked via hole shown in FIG. 11.

Accordingly, as shown in FIGS. 12A and 12B (a perspective diagram and a cross section), a built-up via hole which goes from a B4 layer to a C1 layer will be arranged in a staggered state (zigzag state).

In sum, in a built-up wiring board or a polyimide thin film wiring board, via holes for interconnecting layers are limited to interconnecting only adjacent layers. Thus, in a case where a signal route is routed so that it penetrates at least one or more intervening wiring layers toward the last layer to be reached, via holes for interconnecting all pairs of adjacent layers until the last layer must be sequentially formed, and a route must be routed shortly (to have a short length) in order to shift the via holes. The inventor of the present invention has found a problem in these processes, that is, forming via holes and providing short route must be repeated until the last layer.

Next, with reference to FIG. 13 to FIG. 20, operations required when routing of a multilayer wiring board using a built-up via formed by the technique having the above described problem, will be explained.

In this explanation, a case where a signal net is routed in a B4 layer, and the routed signal net is to be connected to a C1 layer, win be considered.

In this case, a signal net A is firstly routed as shown in FIG. 13. Then, as shown in FIG. 14, the B4 layer and a B3 layer are selected to form a via hole B at a predetermined position. Then, the next step goes to the B3 layer.

Then, as shown in FIG. 15, a short route C having, for example, 100 micrometer is routed in the B3 layer.

Further, as shown in FIG. 16, the B3 layer and the B2 layer are selected to form; a via hole D at the point at which the route C ends. Then, the next step goes to the B2 layer.

Then, as shown in FIG. 17 to FIG. 20, similar steps are repeated until the C1 layer. As a result, a route A, a via hole F, a route G, and a via hole H are formed.

As explained, according to the design method for a multilayer wiring board having the above described problem, steps of forming a via hole which interconnects only adjacent layers, arranging a short route in order to shift the via hole, and forming another via hole must be repeated until the last layer, in order to form a built-up via.

According to the above described conventional design method for designing a multilayer wiring board, via holes for interconnecting layers are Slowed to interconnect only adjacent layers, as described above. Therefore, in a case where via holes need to be formed while penetrating at least one or more intervening wiring layers (in a case where a built-up via is formed), it is necessary to repeat forming a via hole which interconnects only an adjacent layer, routing a short route in order u) shift the via hole, and forming another via hole until reaching the last layer. Thus, there arises a problem that the efficiency of the design becomes very poor.

SUMMARY OF THE INVENTION

To solve the above problem, the present invention relates to providing a design method for a multilayer wiring board which previously sets as a parameter, a via hole size (diameter of a via between each pair of adjacent layers), a shift direction (a direction of shifting a short route for connecting via holes in each layer), and a via pitch (length of a short route in each layer; see FIG. 10B) of each kind of buildup via hole selects a start layer and last layer of a built-up via (for example, a B4 layer and a C1 layer shown in FIGS. 21A and 21B), and instructs the built-up via to be formed, thereby via holes and wiring of intervening layers and last layer can be automatically generated in accordance with the parameter (information represented by the parameter), (that is, via holes and route shown in FIG. 21B can be automatically formed from the state shown in FIG. 21A), and the efficiency of the design can be improved.

A designing method for a multilayer wiring board of using a via hole which interconnects adjacent layers, comprising the steps of reading each parameter of a via hole size, a sit direction, and a via hole pitch of each layer of each built-up via hole storing the parameter in a memory accepting a user-input instruction regarding a start layer and a last layer and routing of the multilayer interconnection based on the user-input instruction and the parameter stored in the memory.

The designing method fen a multilayer wiring board of the present invention may be realized as a program for controlling a computer, which executes processes included in a designing method for a multilayer wiring board having an interconnection route using a via hole, the method comprising reading each parameter of a via hole size, a shift direction, and a via hole pitch of each layer of each built-up via hole storing the parameter in a memory accepting a user-input instruction regarding a start layer and a last layer and routing the multilayer interconnection based on the user-input instruction and the parameter stored in the memory.

BRIEF DESCRIPTION OF THE DRAWINGS

These objects and other objects and advantages of the present invention will become more apparent upon reading of the following detailed description and the accompanying drawings in which:

FIG. 1 is a flowchart showing processes included in a design method for a multilayer wiring board designing method according to a first embodiment of the present invention;

FIG. 2 is a flowchart showing detailed processes included in a parameter reading step of FIG. 1, FIG. 3 is a flowchart showing detailed processes included in a routing step of FIG. 1;

FIG. 11 is a diagram for explaining a stacked via hole;

FIGS. 12A and 12B are diagrams for explaining a built-up via;

DETAILED DESCRIPTION OF THE PREFERRED EMBODIMENTS

The present invention will now be specifically explained with reference to the drawings.

(1) First Embodiment

FIG. 1 is a flowchart for explaining the steps included in the process of a design method for multilayer wiring board according to the first embodiment of the present invention. This process includes a parameter reading step 101, and a routing step 102.

FIG. 2 is a flowchart showing detailed processes included in the parameter reading step 101 of FIG. 1. This process includes a parameter file reading start step 201, a parameter information memory storage step 202, a parameter file end determination step 203, and a parameter file reading completing step 204.

The parameter file end determination step 203 and the parameter file reading completing step 204 constitute a parameter file reading end control step.

FIG. 3 is a flowchart showing detailed processes included in the routing step 102 shown in FIG. 1. This process includes a signal net selection step 301, a wiring layer selection step 302, a built-up via kind selection step 303, a parameter information reading step 304, a via hole/wiring formation step 305, a design rule error existence determination step 306, and a designing completion determination step 307.

Figure 4:
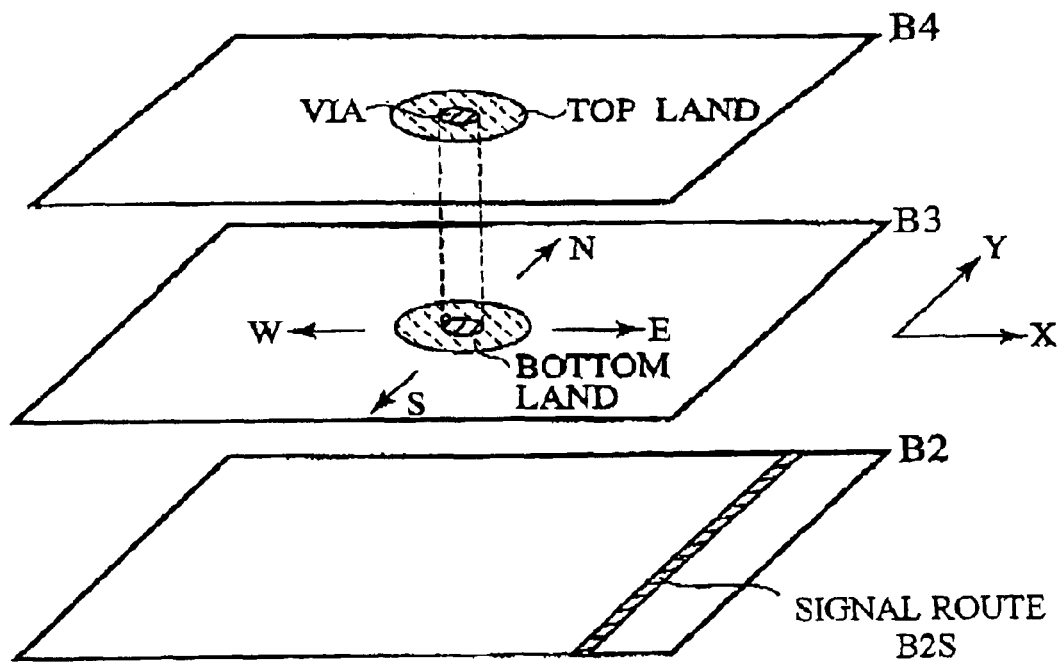
FIG. 4 is a diagram for explaining the kinds of directions of shifting a built-up via which se employed in the design method for multilayer wiring board according to the first embodiment of the present invention.
Figure 5:
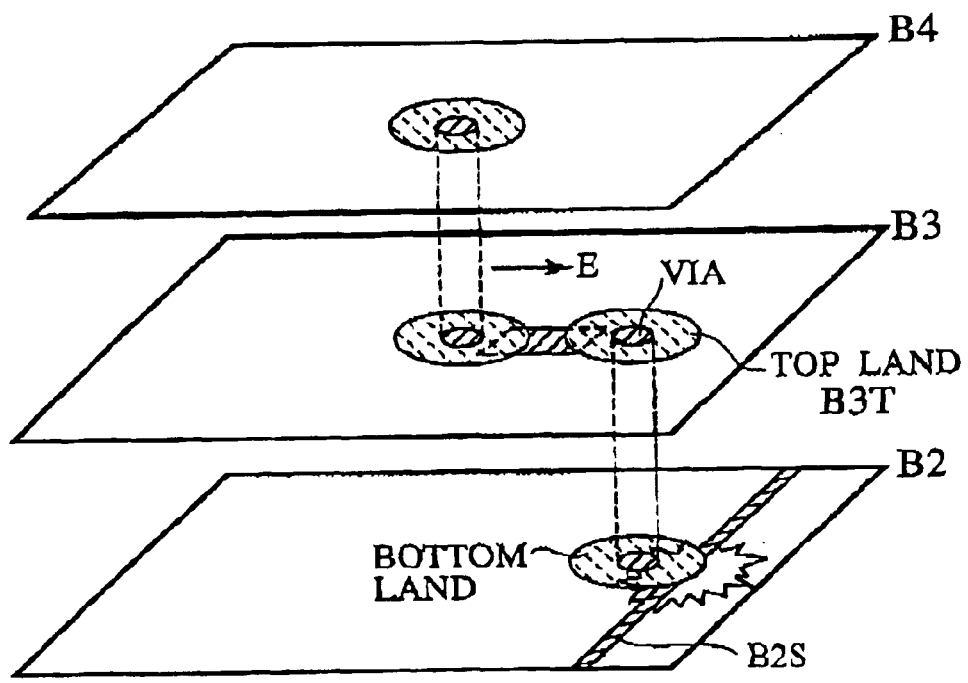
FIG. 5 is a diagram for explaining the kinds of directions of shifting a built-up via which arc employed in the design method for multilayer wiring board according to the first embodiment of the present invention.
Figures 6, 7:
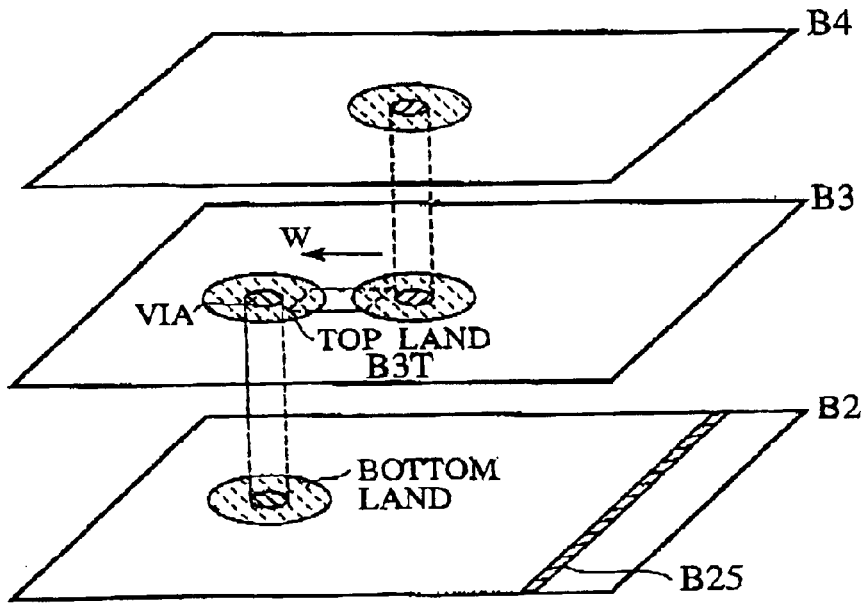
FIG. 6 is a diagram for explaining the kinds of directions of shifting a built-up via which are employed in the design method for multilayer wiring board according to the first embodiment of the present invention.
FIG. 7 is a diagram showing a specific example of a parameter which is employed in the design method for multilayer wiring board according to the first embodiment of the present invention.

FIG. 4 to FIG. 6 are diagrams for explaining the kinds of shift directions of a built-up via, which are employed in the design method for multilayer wiring board according to the present embodiment.

In the multilayer wiring boards shown in FIG. 4 to FIG. 6, in a case where a built-up via for interconnecting a B4 layer and a B2 layer is to be formed, let it be assumed that another signal route (referred to as signal route B2S) exists in the B2 layer.

When a B4 layer-B3 layer via hole (a via hole which interconnects the B4 layer and the, B3 layer) is formed, it is possible to form a top land of a B3 layer-B2 layer via hole in one of four directions N, S, W, and B (see FIG. 4) with respect to the position of a bottom land formed in the B3 layer which is right below the B4 layer-B3 layer via hole.

In a case where this top land (referred to as top land B3T) is formed in the E direction as shown in FIG. 5, a bottom land of the B2 layer and the signal route B2S interfere with each other. Thus, in this case, the top land B3T should be formed in; for example, the W direction as shown in FIG. 6 (the top land B3T may be formed in the N direction or the S direction).

As explained above, according to the present embodiment, there are four kinds of via hole formation in accordance with directions (referred to as shift directions) in which a top land of a via hole between a next pair of layers exists with respect to a bottom land formed in a layer which is right below a formerly-formed via hole.

Capacity of the wiring can be improved if the shift direction is made to be in coordination with route channels. That is, in a case where signal route channels are in the X and Y directions shown in FIG. 4, the four directions N, S, W, and E shown in FIG. 4 are considered to be appropriate as a shift direction (however, more generally, a plurality of arbitrary directions may be appropriate as the shift direction).

FIG. 7 shows a diagram showing a specific example of a parameter employed in the design method for multilayer wiring board according to the present embodiment.

Figure 10A:
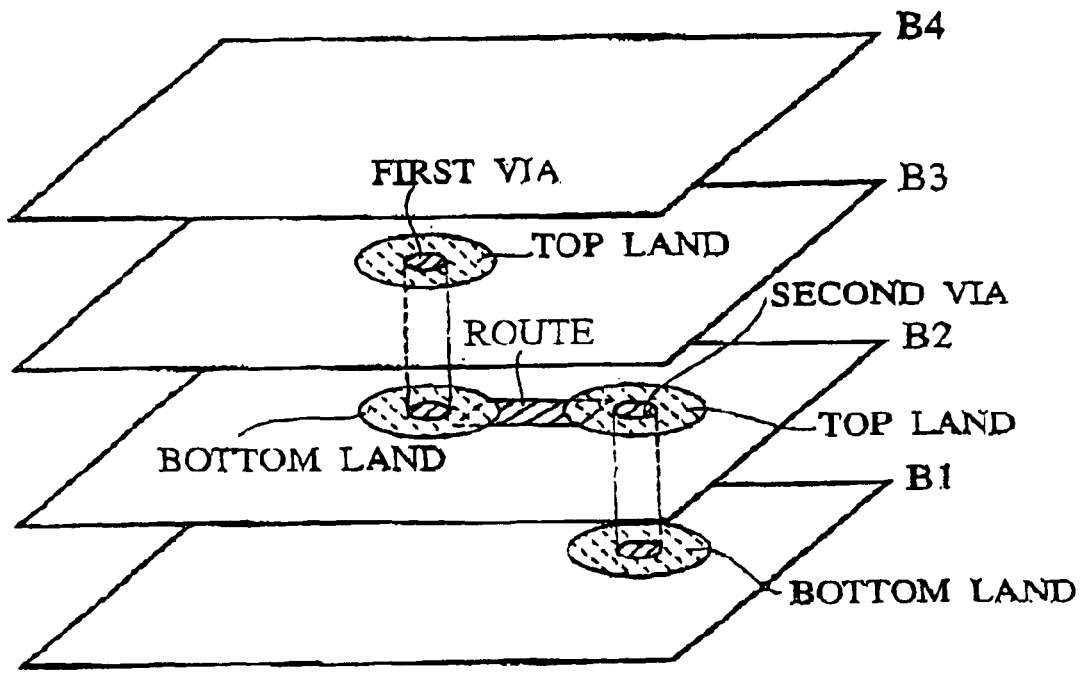
FIGS. 10A and 10B are diagrams for explaining a built-up via.
Figure 10B:
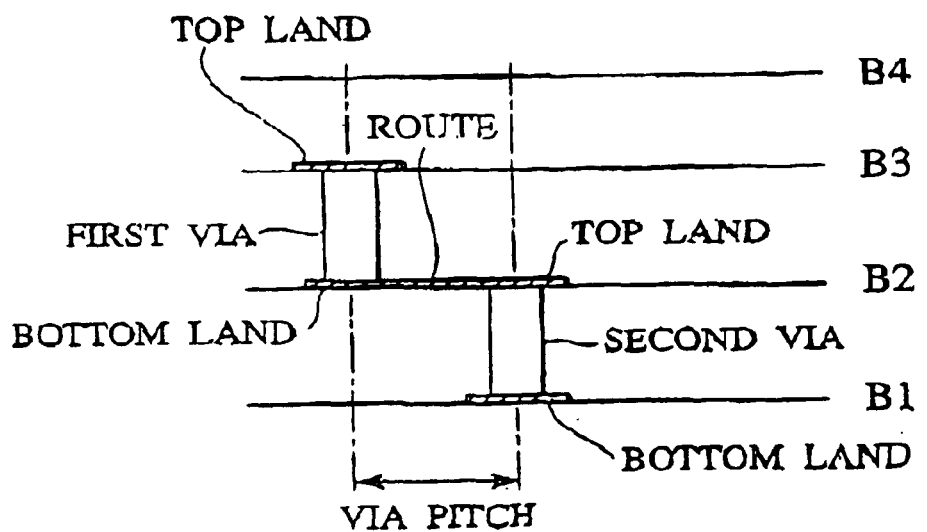
Figure 13:
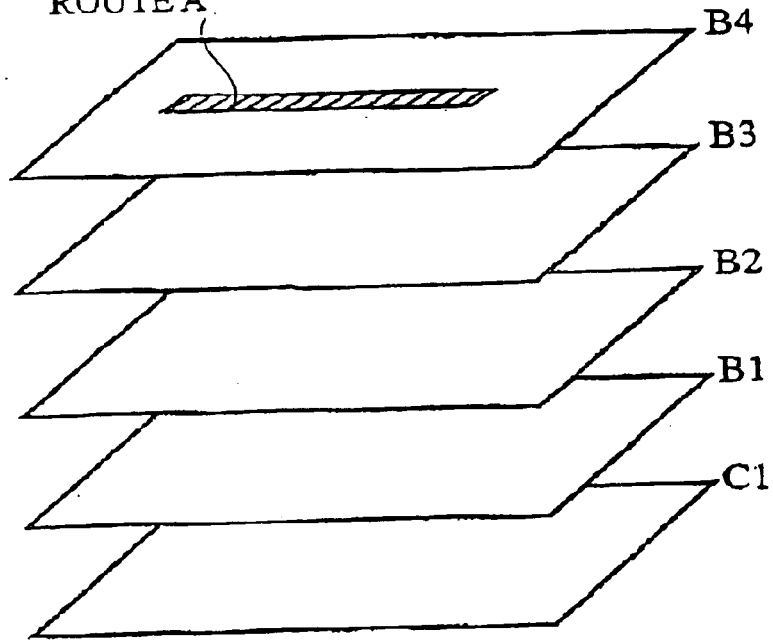
FIG. 13 is a diagram for explaining a process of a conventional multilayer wiring board.
Figure 14:
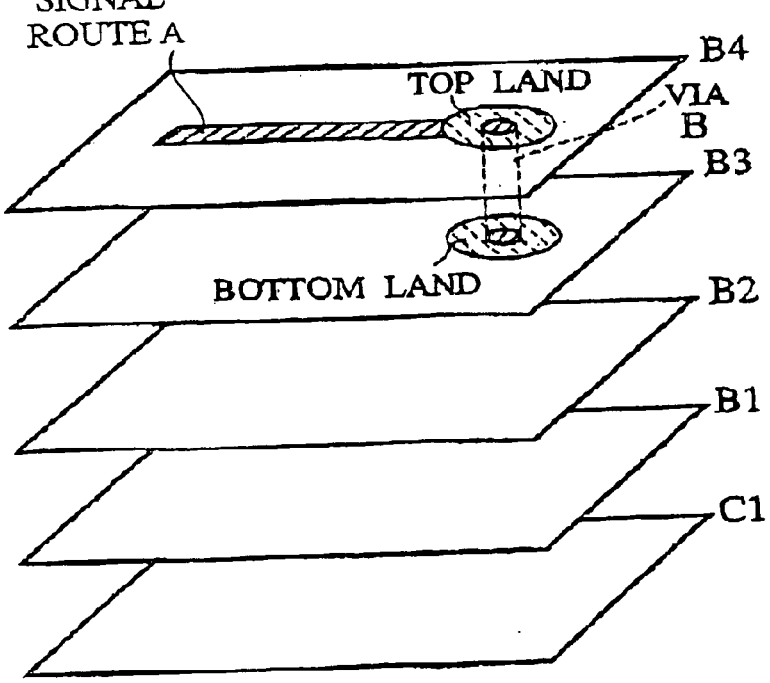
FIG. 14 is a diagram for explaining a process of a conventional multilayer wiring board.
Figure 15:
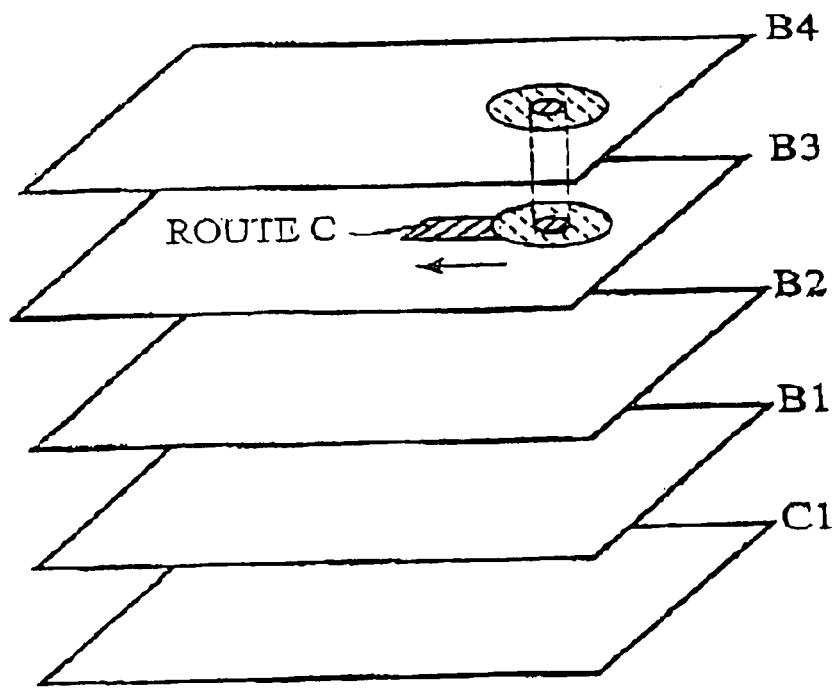
FIG. 15 is a diagram for explaining a process or a conventional multilayer wiring board.
Figure 16:
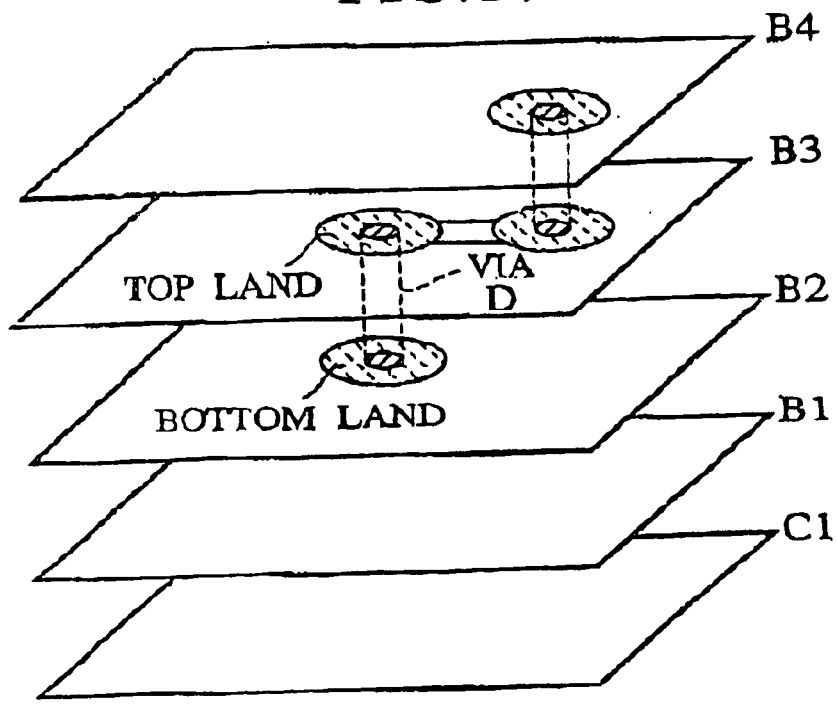
FIG. 16 is a diagram for explaining a process of a conventional multilayer wiring board.
Figure 17:
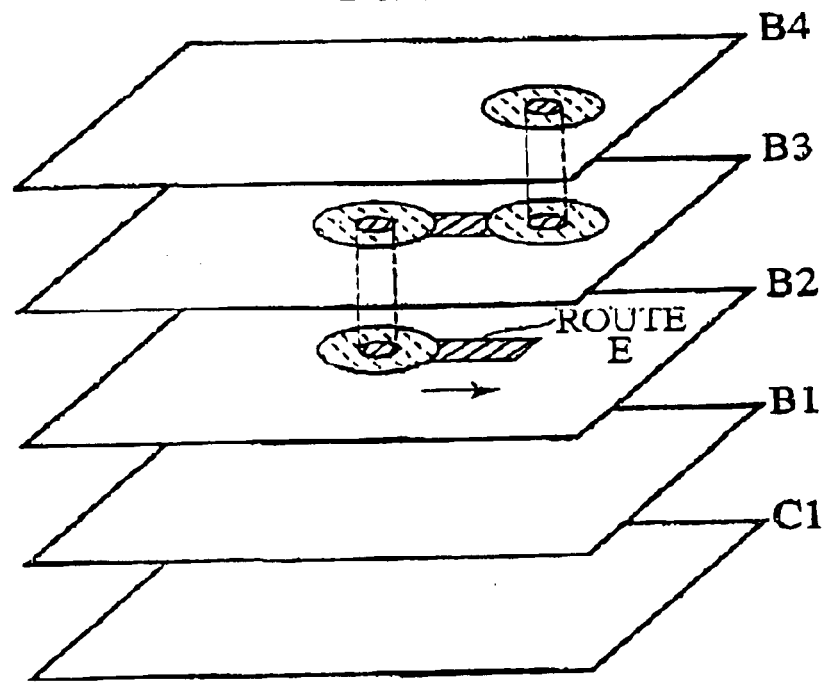
FIG. 17 is a diagram for explaining a process of a conventional multilayer wiring board.
Figure 18:
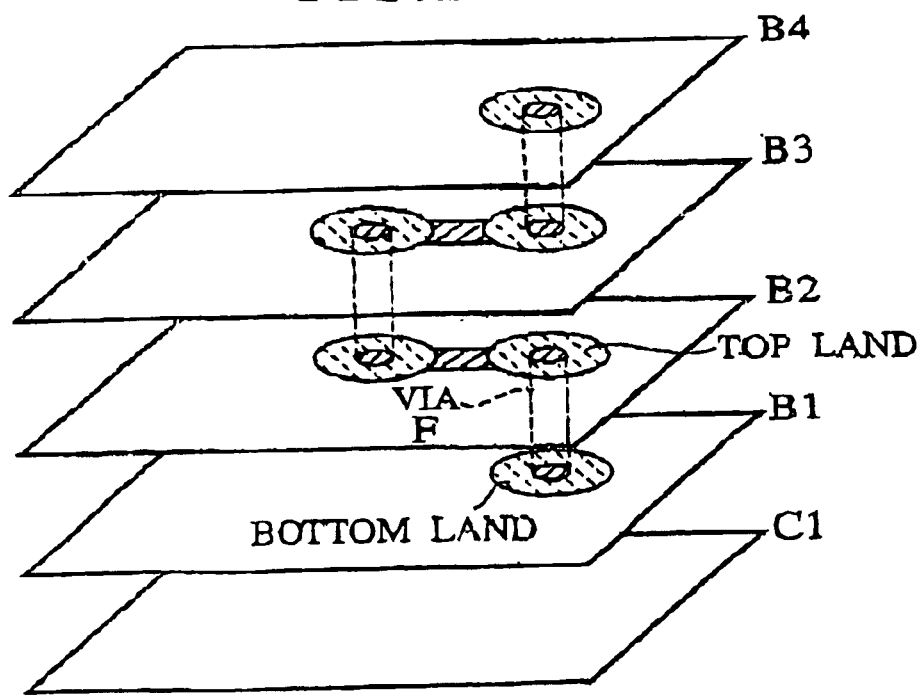
FIG. 18 is a diagram for explaining a process of a conventional multilayer wiring board.
Figure 19:
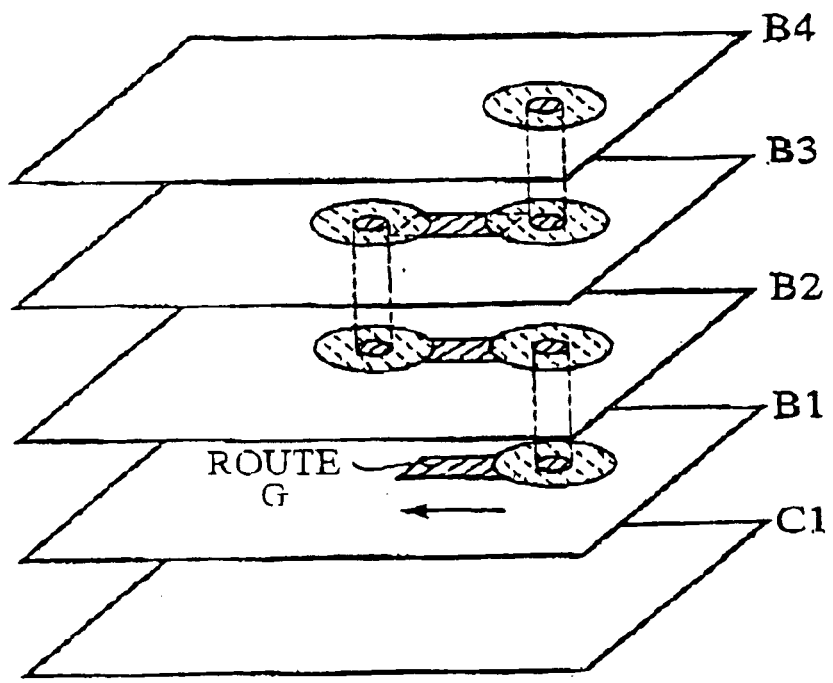
FIG. 19 is a diagram for explaining a process of a conventional multilayer wiring board.
Figure 20:
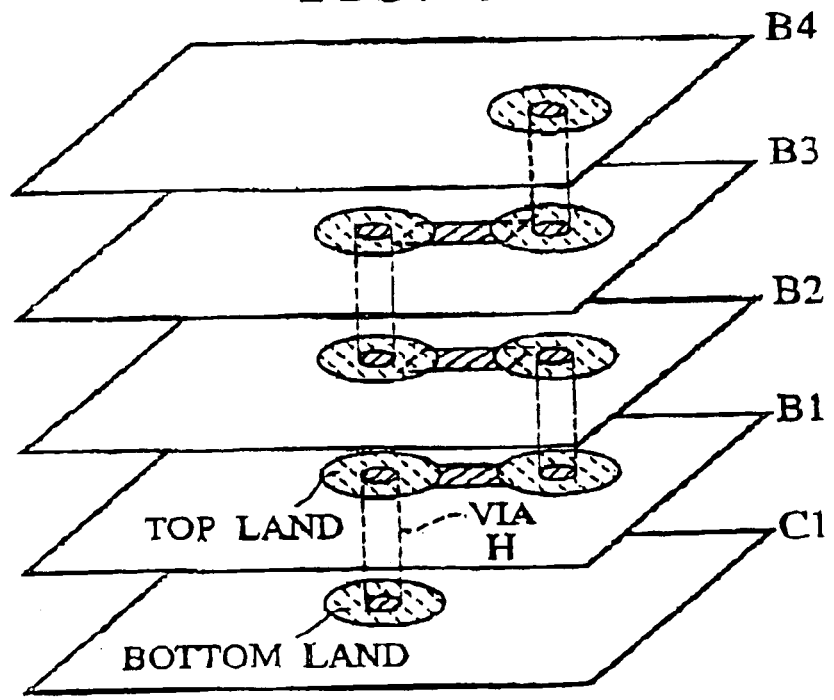
FIG. 20 is a diagram for explaining a process of a conventional multilayer wiring board.
Figure 21B:
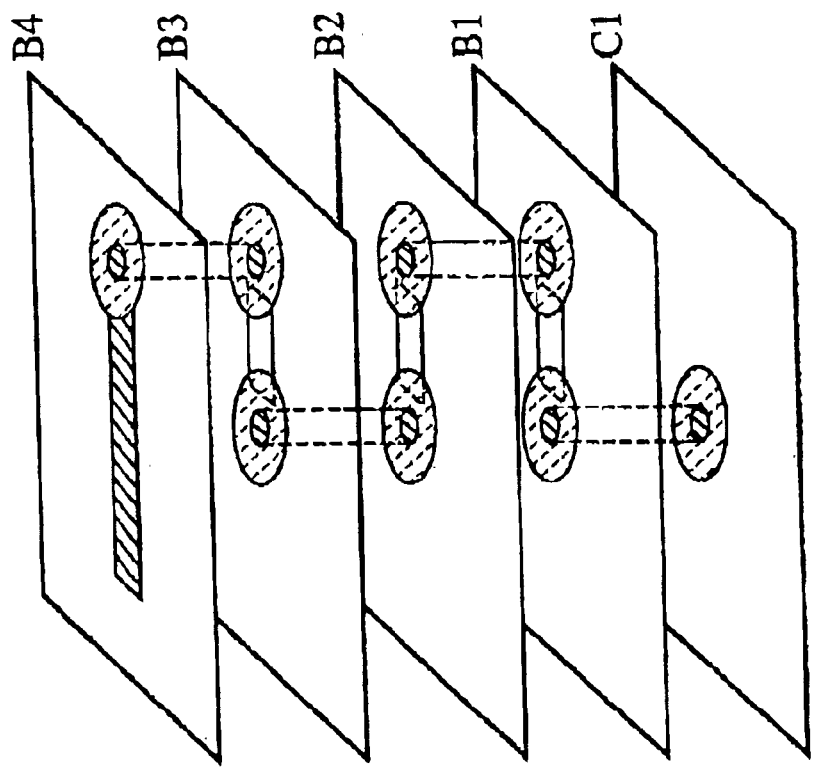
FIGS. 21A and 21B are diagrams for explaining a point that the design method for multilayer wiring board of the present invention from the prior art.
Figure 21A:
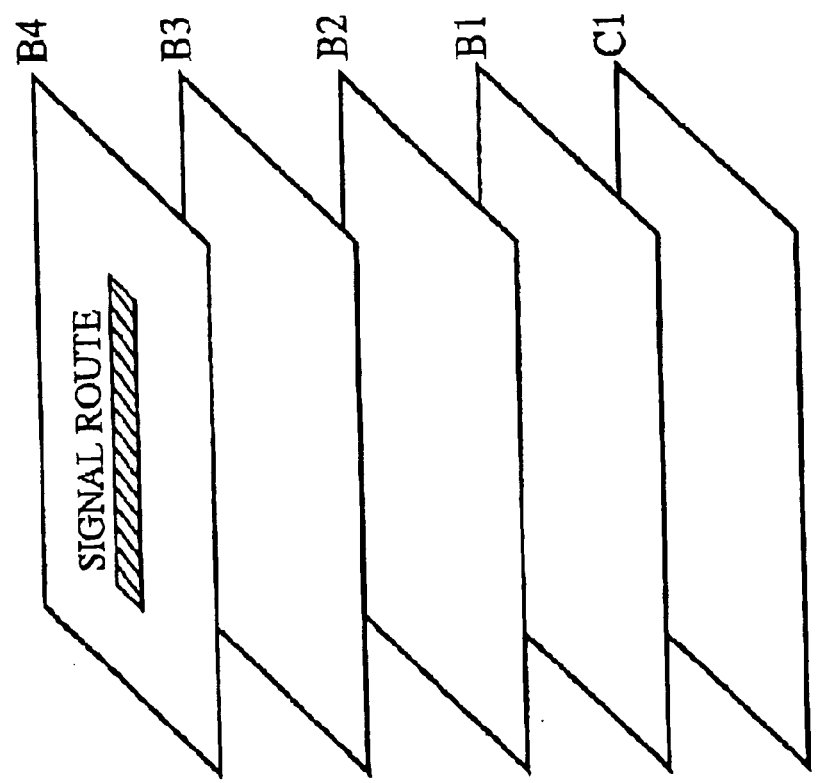

As a parameter (set for each kind of built-up via), at least the size of a via hole between each pair of adjacent layers, a shift direction in each layer (there are four directions N, S, W, and E (see FIG. 4)), and a via hole pitch in each layer (see FIG. 10) are set.

Contents of a set parameter will be specifically explained by employing FIG. 7 as an example.

The parameter shown in FIG. 7 includes the following lines a to j. The symbols a to j in FIG. 7 are intended for explanatory convenience, but do not represent the information of the parameter.

a. An annotation line.

b. A line representing the name (identification information) of a kind of built-up via whose details are set in the third line (line c) and thereafter. Here, the name is BUILT-UP 75-E.

c. built-up is a command name of a command for instructing formation of a via hole. The command in this line instructs that a via hole VIA 75 (a via hole having φ75 micrometer) should be formed between a B4 layer and a B3 layer.

d. moveto is a command name of a command representing a shin each layer. The command in this line instructs that positioning should be performed by shifting from the position of the via hole formed in accordance with the command in the line c toward the E direction by +75 micrometer, while routing LINE 75 (a route having a width of 75 micrometer) (that is, when viewing from the B4 layer, shifting toward the E direction by 75 micrometer in the B3 layer). 0 after +75 indicates that the position does not shift toward N/S directions.

e. Likewise c, formation of a via hole VIA 75 between the B3 layer and a B2 layer is instructed.

f. Likewise d, a shift from the position of the via hole formed in accordance with the command e toward the E direction by −75 micrometer (toward the W direction by +75 micrometer) in the B2 layer is instructed.

g. Likewise c and e, the formation of a via hole VIA 75 between the B2 layer and a B1 layer is instructed.

h. Likewise d and f, a shift from the position of the via hole formed in accordance with the command g toward the E direction by +75 micrometer in the B1 layer is instructed.

i. Likewise c, e, and g, the formation of a via hole VIA 75 between the B1 layer and a C1 layer is instructed.

j. A shift from the position of the via hole formed in accordance with the command i toward the E direction by −350. micrometer with a route LINE 120 in the C1 layer is instructed.

The shift directions set by this parameter are the E direction in the B3 layer, the W direction in the B2 layer, and the E direction in the B1 layer. The shift directions of the parameter are determined in accordance with the shift direction in the B3 layer, which is the first intervening layer (therefore, a letter E is attached to the name of the kind of built-up via BUILT-UP 75-E set by this parameter).

Next, the entire operations of the design method for multilayer wiring board according to the present embodiment will be specifically explained with reference to FIG. 1 to FIG. 7.

As shown in FIG. 1, the process of the design method for multilayer wiring board according to the present embodiment consists of the parameter reading step 101 (a step in which parameters are read) and the routing step 102 (a step in which route are routed). In the parameter reading step 101, a parameter including a via hole size, shift direction, and via hole pitch of each layer of each kind of built-up via to be formed in a multilayer wiring board which is the design target is read, and then, information represented by the parameter (parameter values) are stored in a memory. In the routing step 102, signal net of a multilayer wiring board having built-up vias are designed based on the information of the parameters stored in the memory in the parameter reading step 101, and an instruction relating to a start layer (a layer in which a via hole is formed first) and a last layer (a layer to which the via bole finally reaches).

Specifically, those two steps are as follows.

First, detailed processes performed in the step of reading parameters will be explained with reference to FIG. 2.

Reading of a parameter file regarding a multilayer wiring board which is a target of the design is started (step 201), in order to preset a size of a via hole between each pair of adjacent layers, and a shift direction and via hole pitch in each layer regarding each kind of built-up via, to a computer system. In this step, each parameter included in the parameter file is sequentially read.

As explained above, a parameter is a format which sets a via hole size, shift direction and via pitch of each layer (wiring layer; each layer is identified by a wiring layer name) of each kind of built-up via.

Next, information of the parameter (parameter values) representing a size of a via hole between each pair of adjacent layers, a shift direction in each layer, a via hole pitch in each layer, etc. is stored in a memory while using each kind of built-up via of each read parameter as a key (step 202).

Each time the process of step 202 is completed for each parameter, whether EOF is detected or not is checked, so that whether the parameter file of the multilayer wiring board which is the target of design ends or not is determined (step 203).

In a case where it is determined in step 203 that EOF is detected (the parameter file ends), reading (acquiring) of the parameter file is completed (step 204).

Second, detailed processes performed in the step of routing will be explained with reference to FIG. 3.

A desired signal net of the multilayer wiring board which is the target of design is selected in accordance with an instruction of a designer (user) (step 301).

A signal net is information regarding connection between electronic components. In relation to this, a signal route or a route is a route that is actually formed based on the signal net (that is, an actual conductive line between electronic components that for the signal net).

When a built-up via is needed, a start layer and a last layer are designated in accordance with an instruction of the designer (step 302). Specifically, the start layer and the last layer are selected and displayed on the screen of a display device.

Then, a kind of built-up via is selected in accordance with an instruction of the designer, and based on whether there is any obstruction against a via hole in the intervening layers and the last layer, and on consideration of the constants on a wiring (step 303).

An obstruction is found in a case where there is a route of another net (another signal net), or a via hole of another not in the intervening layers and the last layer (see FIG. 5 for example). In the selection process in step 303, a kind of built-up via is selected so as to avoid such an obstruction.

Constraints on a wiring are mainly restrictions originating from the length of a route. In the selection process in step 303, carefulness is required so as not to select a kind of built-up via hole which cannot maintain a prefixed length of a route in the intervening layers and the last layer (for example, in case of shifting to a direction different from the aimed direction, the length of a route becomes longer).

Then, the parameter information (via bole size, shift direction, via pitch, etc.) is read out from the memory while using the kind of built-up via hole selected in stop 303, and each wiring layer determined by the start layer and last layer designated in step 302 as a key (step 304).

Then, based on the parameter information read in step 304, a via hole is formed in each layer, and a route is formed in each layer (Step 305).

When the process of step 305 is completed, the computer system checks whether or not there is any violation of design rules such as spacing with respect to another net in the intervening layers and the last layer, due to the formation of via holes and route (whether or not there is any error that occurred against the design rules) (step 306).

In a case where it is determined in step 306 that a design rule is violated (there is an error that occurred against the design rules), the control is returned to step 303, selection of a kind of built-up via hole is made again.

On the other hand, in a case where it is determined in step 306 that no design rule is violated (there is no error that occurred against the design rules), whether or not routing (connection) of all signal nets included in the multilayer wiring board which is the target of design is completed or not, is checked (step 307).

In a case where it is determined in step 307 routing of all signal nets is not completed, the control is returned to step 301, and the series of processes shown in FIG. 3 is repeated.

On the other hand, in a case where it is determined in step 307 routing of all signal nets is completed, the processes of the routing step are completed.

It should be noted that a kind of built-up via does not vary depending on that a built-up via goes from which layer to which layer. In the present embodiment, that is, in the present invention, necessary information regarding wiring layers included in the preset parameter is read out by designating a layer in which the designer wants a via hole to be formed first (start layer) and a layer which the designer wants the via hole to finally reach (last layer).

For example, in a case where the designer wants to form a built-up via from a B4 layer to a B2 layer, the B4 layer and the B2 layer are selected as the start layer and the last layer. And a parameter for a kind of built-up via which is set from the B4 layer to the C1 layer is selected, but a via hole is formed only as far as the B2 layer, and the via hole is stopped there.

(2) Modified/Expanded Version of First Embodiment

In the above described first embodiment, a built-up wiring board was employed as an example of a multilayer wiring board which is suitable as a target of design However, a multilayer wiring board which can be a target of design according to the present invention is not limited to this.

Figure 8:
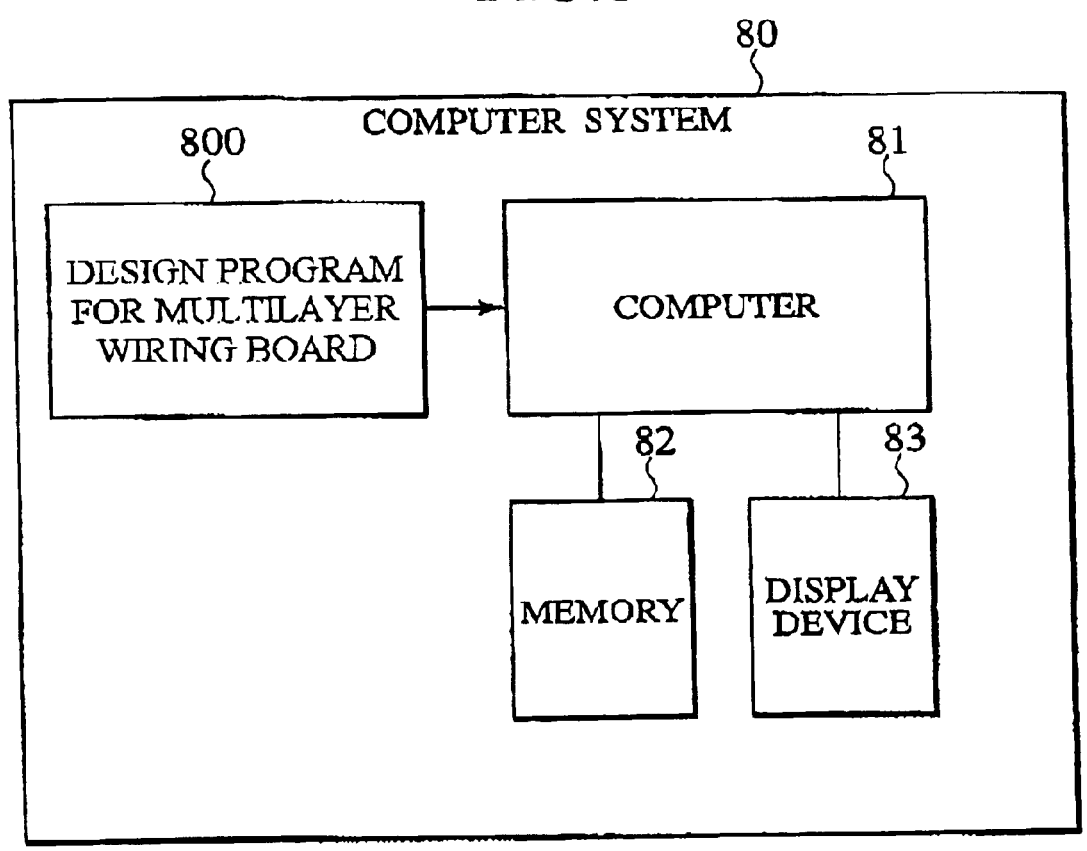
FIG. 8 is a block diagram showing a structure of a second embodiment of the present invention.
Figure 9:
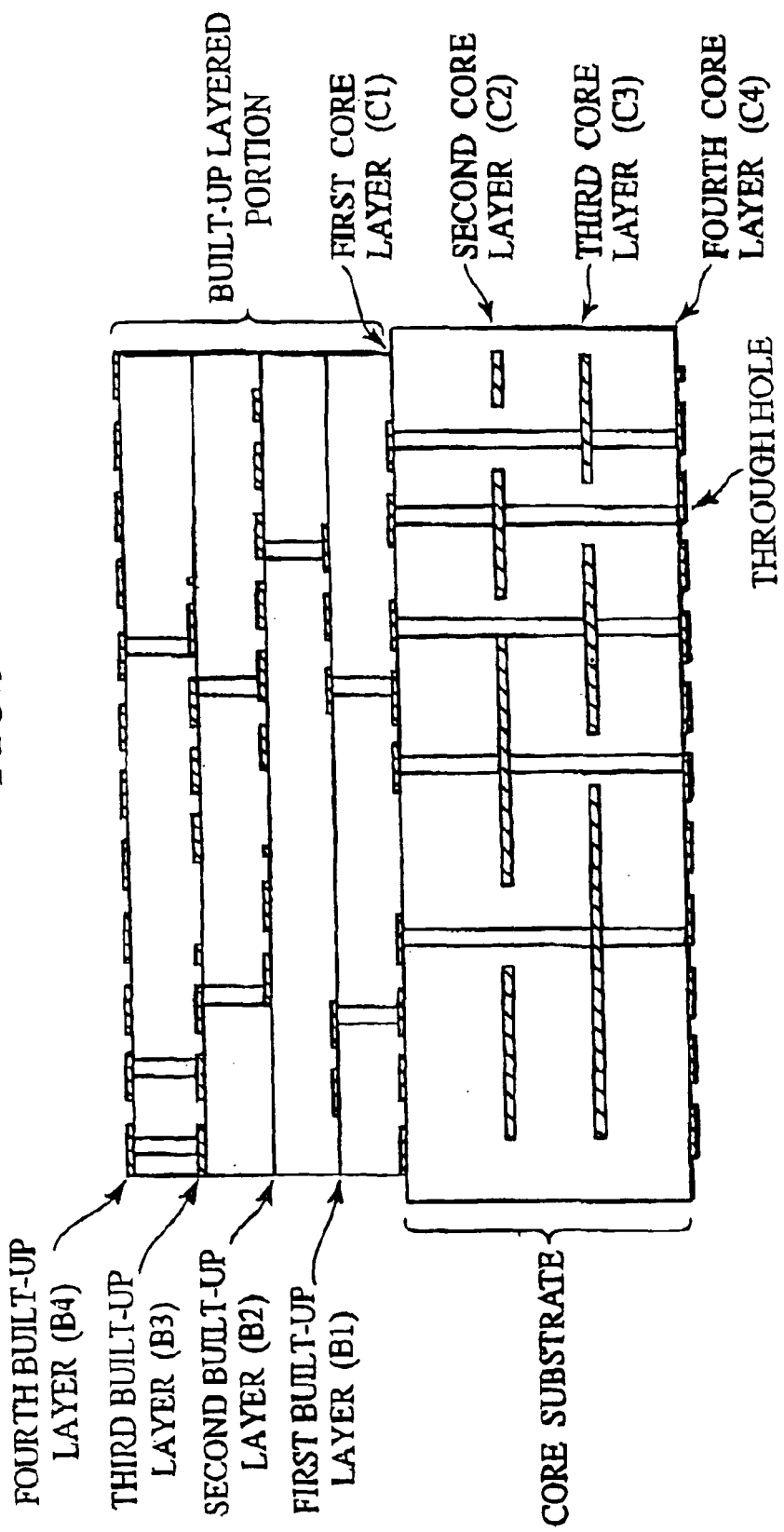
FIG. 9 is a diagram showing a structure of a specific example of a built-up wiring board.

As another example of a multilayer wiring board which can be a target of design, a polyimide thin film wiring board (a multilayer wiring board made of insulation layers and wiring layers alternately, which are formed by using photosensitive polyimide resin as an insulation material, forming a via hole in this resin layer, forming a wiring layer using photolithography, vacuum deposition or sputtering, and plating methods, and repeating the series of those processes), is considered, (3) Second Embodiment FIG. 8 is a block diagram showing a structure of the second embodiment (a structure of a computer system) of the present invention, This computer system 80 comprises a computer 81, a memory 82, a display device 83, and a design program for a multilayer wiring board 800.

With reference to FIG. 8, the second embodiment of the present invention is realized as the design program for a multilayer wiring board 800 for executing the processes of the design method for multilayer wiring board according to the first embodiment shown in FIG. 1.

The design program for a multilayer wiring board 800 is read into the computer 81 of the computer system 80, and acts so as to control the computer 81 to execute the processes of the design method for multilayer wiring board according to the first embodiment (see FIG. 1 to FIG. 3). The operation of the computer system 80 in accordance with a control of the design program for a multilayer wiring board 800 is completely the same as the contents of the processes of the design method for multilayer wiring board according to the first embodiment. Thus, a detailed explanation will be omitted.

As explained above, according to the present invention, an effect that efficiency of design is improved, can be obtained when routing of a multilayer wiring board which is interconnected only by via holes between only adjacent layers such as a built-up wiring board, just by designating a start layer and a last layer, and enabling a built-up via to be automatically generated in both of the start layer and last layer, and the wiring layers between them.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2001-150433 filed on May 21, 2001 and including specification, claims, drawings and summary. The disclosure of the above Japanese Patent Application is incorporated herein by reference in its entirety.

What is claimed is:

1. A design method for a multilayer wiring board having a via hole which interconnects adjacent layers, comprising the steps of:

reading each parameter of a via hole size, a shift direction, and a via hole pitch of each layer of each via hole;

storing said parameters in a memory;

accepting a designation of a start layer and a last layer from among a plurality of layers of said multilayer wiring board to be designed; and routing of said multilayer wiring board based on said information indicated by said parameters stored in said memory in said storing step and said designation, wherein said routing step includes:

a signal net selecting step of selecting a signal net by a user-input instruction;

a wiring layer selecting step of selecting wiring layers based on said designation of said start layer and said last layer;

a via hole selecting step of selecting one of said via holes by said user-input instruction;

a parameter reading step of reading said parameters of said selected one of said via holes regarding said selecting wiring layers;

a via hole/routing forming step of forming a via hole and routing for said signal net selected, based on said read parameters;

a design error absence/presence determining step of checking for an error relative to a design;

a reselecting step of returning to said via hole selecting step in a case where it is determined that there is an error relative to the design, and again reading said parameters including a reselecting of a shift direction; and a design completion determining, step of determining whether or not formation of a via hole and routing is completed for said signal net included in the multilayer wiring board.

2. The design method for a multilayer wiring board according to claim 1, wherein said reading each parameter comprises the steps of:

starting reading of a parameter file which stores said parameter;

storing said parameter started reading of said parameter file in said memory; and determining and controlling an end of reading of said parameter file by checking EOF of said parameter file, each time said storing said parameter completes.

3. The design method for a multilayer wiring board according to claim 1, wherein said shift direction is one of N, S, W, and E directions which are in coordination with a direction of a signal route channel.

4. The design method for a multilayer wiring board according to claim 1, wherein said multilayer wiring board is a built-up wiring board.

5. A program for controlling a computer, which executes processes included in a design method for a multilayer wiring board having an interconnection design with a via hole, said method comprising:

reading each parameter of a via hole size, a shift direction, and a via hole pitch of each layer of each via hole;

storing said parameters in a memory;

accepting a designation of a start layer and a last layer from among a plurality of layers of said multilayer wiring board to be designed; and routing of said multilayer wiring board based on said information indicated by said parameters stored in said memory in said storing step and said designation, wherein said routing step includes:

a signal net selecting step of selecting a signal net by a user-input instruction;

a wiring layer selecting step of selecting wiring layers based on said designation of said start layer and said last layer;

a via hole selecting step of selecting one of said via holes by said user-input instruction;

a parameter reading step of reading said parameters of said selected one of said via holes regarding said selecting wiring layers;

a via hole/routing forming step of forming a via hole and routing which are designed for said signal net selected, based on said read parameters;

a design error absence/presence determining step of checking for an error relative to a design;

a reselecting step of returning to said via hole selecting step in a case where it is determined that there is an error relative to the design, and again reading said parameters including a reselecting of a shift direction; and a design completion determining step of determining whether or not formation of a via hole and wiring is completed for said signal net included in the multilayer wiring board.

6. The program according to claim 5, wherein said reading each parameter comprises the steps of:

starting reading of a parameter file which stores said parameter;

storing said parameter started reading of said parameter file in said memory; and determining and controlling an end of reading of said parameter file by checking EOF of said parameter file, each time said storing said parameter completes.

7. A method of designing a route for via holes that connect two layers of a multilayer wiring board that are separated from each other by at least another layer, the method comprising the steps of:

storing via hole parameters in a memory for each of the layers of the multilayer wiring board, the via hole parameters including via hole size, shift direction, and via hole pitch;

reading the stored via hole parameters;

designating one of the two layers as a start layer and designating the other of the two layers as a last layer;

following the reading and designating steps, designing a route for the via holes from the start layer, through the at least another layer that is between the start and last layer, and to the last layer, based on the via hole parameters read in the reading step and the start and last layers designated in the designating step; and determining whether the designed route has an error and, if an error is found in the designed route, changing the shift direction, repeating the designing step with the changed shift direction, and repeating the determining step.

* * * * *